United States Patent [19]
Mangold et al.

[11] Patent Number: 5,916,513
[45] Date of Patent: Jun. 29, 1999

[54] METHOD AND APPARATUS FOR AFFIXING COMPONENTS TO A SUBSTRATE WHEN A MANUFACTURING LINE CEASES OPERATION

[75] Inventors: Richard Lee Mangold, Lake Worth; Ovidiu Neiconi; Christopher Lee Becher, both of Boynton Beach, all of Fla.

[73] Assignee: Motorola, Schaumburg, Ill.

[21] Appl. No.: 08/905,621

[22] Filed: Aug. 4, 1997

[51] Int. Cl.⁶ .............................. H01L 21/58; H01L 21/68
[52] U.S. Cl. .............................. 29/25.01; 438/6; 438/107; 438/118; 438/907
[58] Field of Search .............................. 29/25.01; 438/6, 438/107, 118, 119, 907

[56] References Cited

U.S. PATENT DOCUMENTS

| | | |
|---|---|---|
| 4,127,432 | 11/1978 | Kuwano et al. |
| 4,741,787 | 5/1988 | Shimizu et al. |
| 4,941,255 | 7/1990 | Bull. |
| 5,681,757 | 10/1997 | Hayes. |
| 5,851,852 | 12/1998 | Ostop et al. |
| 5,858,806 | 1/1999 | Nishida. |

*Primary Examiner*—David Graybill
*Attorney, Agent, or Firm*—Eduardo Guntin

[57] ABSTRACT

An apparatus (400) enclosing a portion of a substrate (401) is used for affixing at least one component to a corresponding circuit of the substrate when a manufacturing line (800) ceases to operate. The apparatus includes a conveyor (400), heating elements (102), and a controller (816) for controlling operation of the apparatus (400). The conveyor is used for indexing the substrate periodically through the apparatus. The heating elements are used for dividing the portion of the substrate enclosed by the apparatus into controllable temperature zones (902). The controller is adapted to cause each of the plurality of heating elements to dynamically adjust the temperature of each of the controllable temperature zones upon the indexing process of the manufacturing line (800) ceasing to operate, until at least one component of each circuit enclosed by the apparatus has been adequately affixed to its corresponding circuit.

23 Claims, 11 Drawing Sheets

404, 405

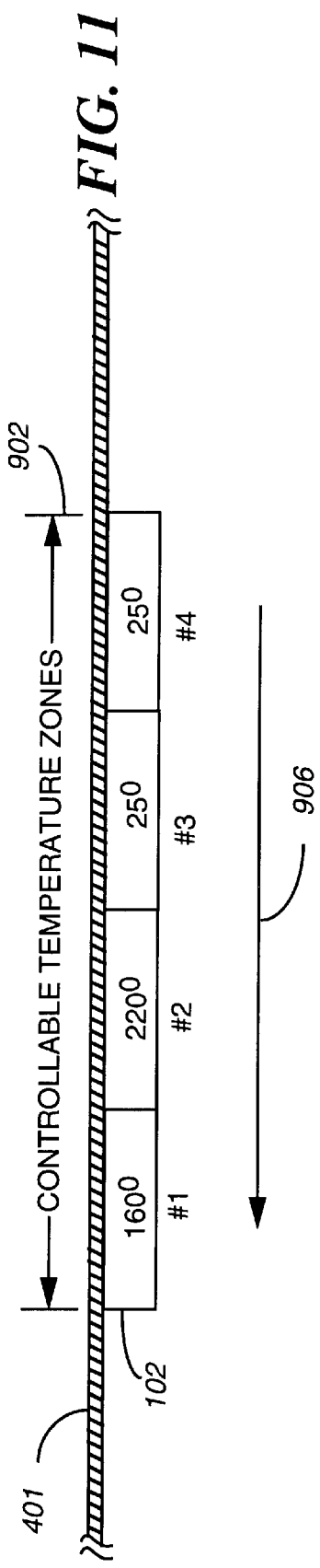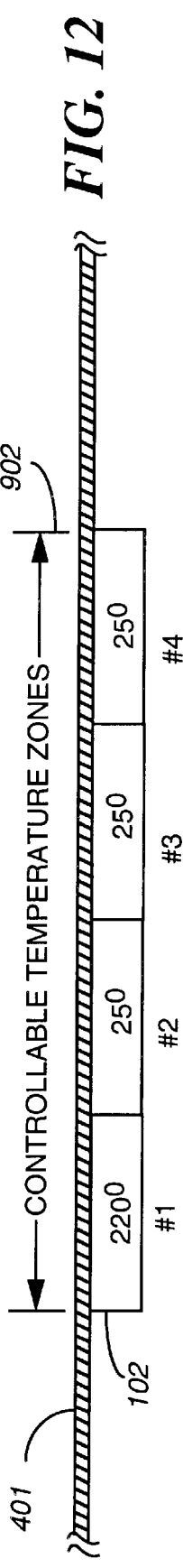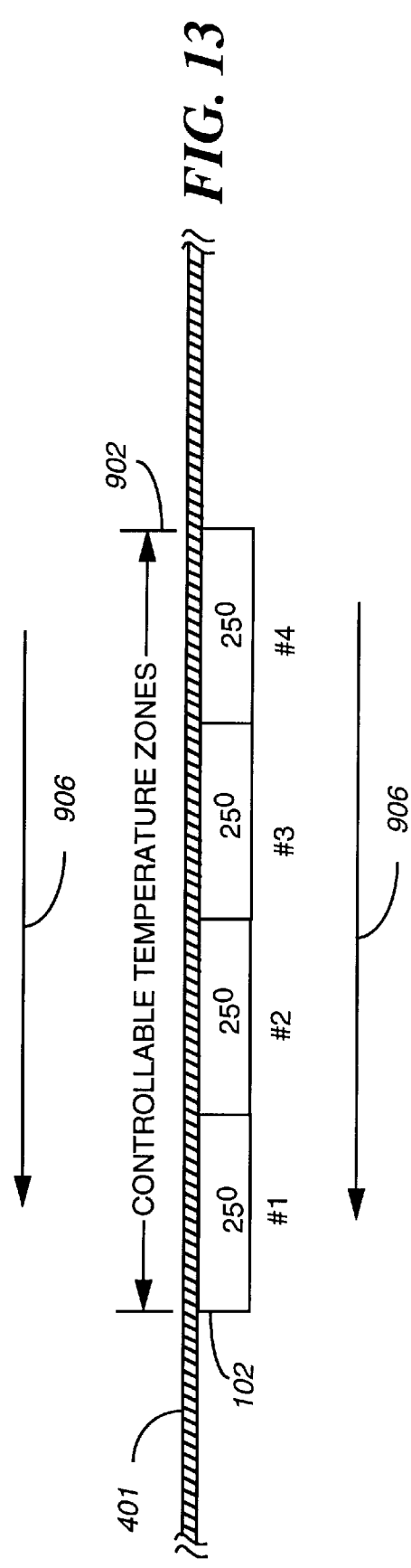

METHOD AND APPARATUS FOR AFFIXING COMPONENTS TO A SUBSTRATE WHEN A MANUFACTURING LINE CEASES OPERATION

FIELD OF THE INVENTION

This invention relates in general to the assembly of circuit components on substrates, and particularly to a method and apparatus for affixing components to a substrate when a manufacturing line ceases operation.

BACKGROUND OF THE INVENTION

Manufacturing electronic circuits on rigid PCB's (printed circuit boards) constructed of, for example, epoxy glass laminate is well known. For consumer products such as pagers, watches and hand-held calculators, rigid PCB's have provided an effective method for the manufacture of such products.

However, as miniaturization continues to be a driving force in the technology market, new methods are under investigation to determine how to reduce the thickness of PCB's and more importantly how to manufacture new PCB technologies reliably and at low cost. As a byproduct of these investigations, engineers have turned their interest to the use of flexible substrates for carrying a multiplicity of circuits that traditionally were carried by rigid PCB's. Such substrates are constructed of, for example, polyimide material and are readily available at a low cost.

Although flexible PCB substrates have the attractive feature of being inexpensive, their lack of rigidity has made manufacturability a complex challenge. Presently, the manufacture of dense circuits, which include fine-pitch surface mount devices, is expensive and not easily repeatable in a reliable fashion over large volumes of flexible PCB substrates. Yet another disadvantage in prior art manufacturing machines is their inability to salvage portions of a substrate when one of the manufacturing machines experiences a fault causing the manufacturing line to cease operation.

Accordingly, a method and apparatus would be desirable that would overcome the foregoing disadvantages described in the prior art.

BRIEF DESCRIPTION OF THE DRAWINGS

The present invention is pointed out with particularity in the appended claims. However, other features of the invention will become more apparent and best understood by referring to the following detailed description in conjunction with the accompanying drawings in which:

FIGS. 11–13 show how the controllable temperature zones are adjusted to salvage portions of the substrate when the manufacturing line ceases to operate according to the present invention.

DESCRIPTION OF THE PREFERRED EMBODIMENT

Figure 1:
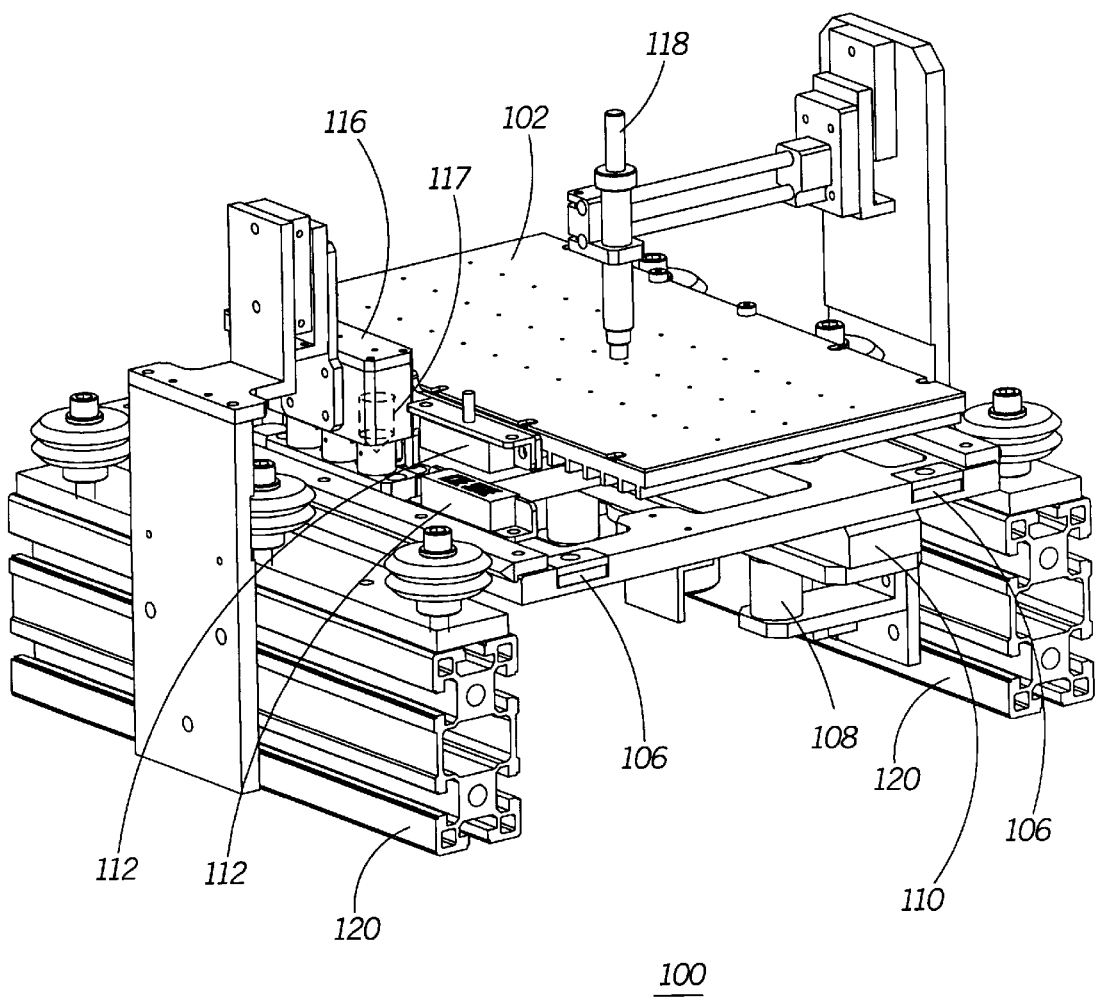
FIG. 1 shows a perspective view of a pallet for carrying a substrate according to the present invention.
Figure 2:
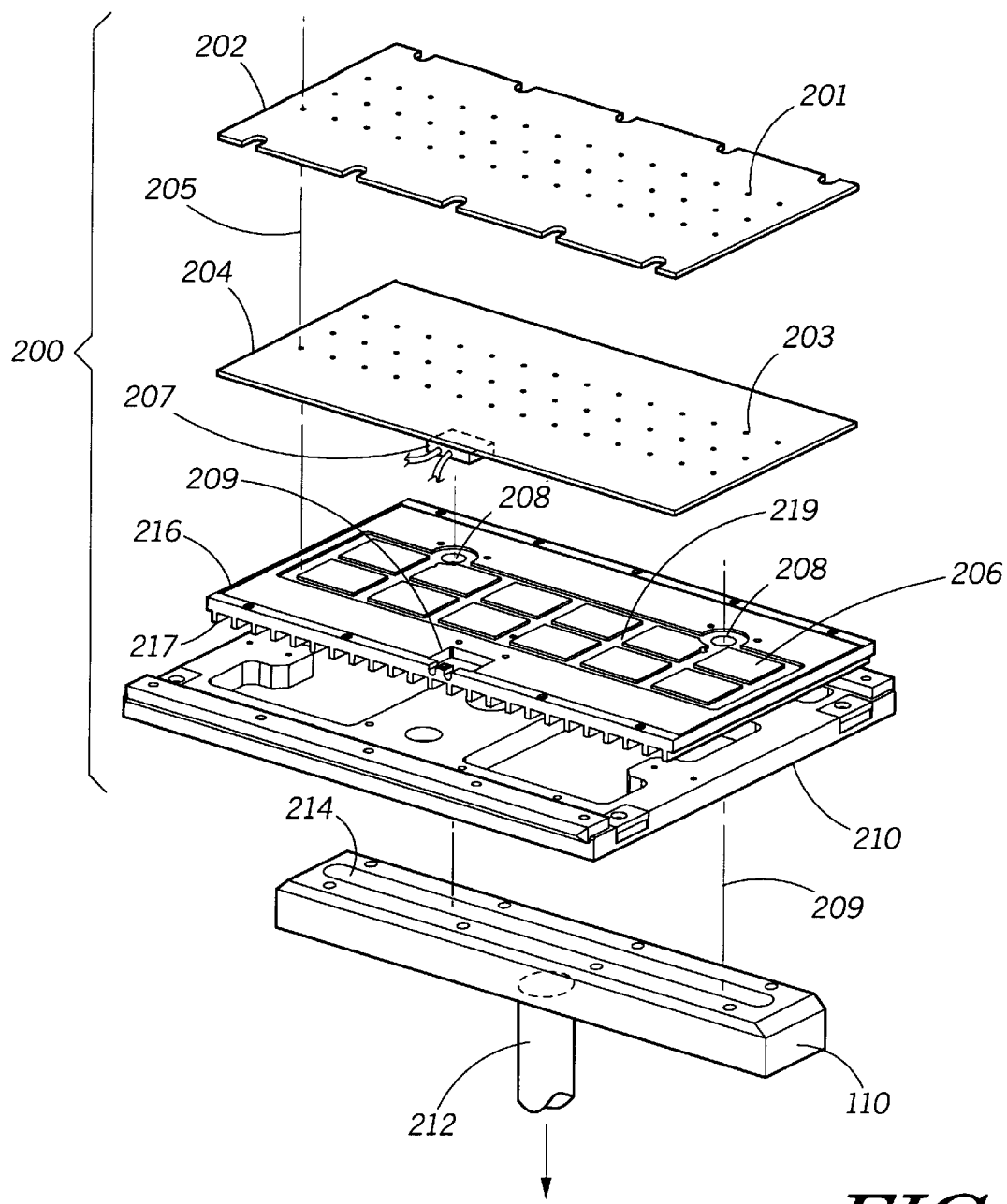
FIG. 2 shows a perspective view of an assembly of the pallet and the position of a vacuum plenum with respect to the pallet according to the present invention.

Before introducing the apparatus 400 (shown in FIG. 4), details of a pallet 102 used by the apparatus 400 for carrying a substrate therethrough will be described first by way of FIGS. 1–3. FIG. 1 shows a perspective view 100 of the pallet 102 guided by a linearly slidable track 120 (cross-section shown) according to the present invention. As show in FIG. 1, the top surface of the pallet 102 has perforations. These perforations are coupled to a conventional vacuum source (not shown) for applying adhering forces to a substrate carried by the pallet 102. The vacuum effect originates from a vacuum plenum 110 positioned below the pallet 102, which is coupled to the vacuum source. The vacuum plenum 110 is capable of linearly displacing in a vertical direction by way of a conventional spring mechanism 108 coupled thereto. This allows for a close surface-to-surface contact between a vacuum opening at the bottom of the pallet 102 (not shown), and the vacuum plenum 110 as the pallet 102 is indexed through the apparatus 400 in a linear direction. This coupling effect will become clearer after the elements of the pallet 102 shown in FIG. 2 are described.

The pallet 102 includes a heating element for applying a controlled temperature to the substrate carried by the pallet 102. To monitor this temperature, a conventional thermal sensor 118 is coupled to the linearly slidable track 120 and positioned above the pallet 102 as shown in FIG. 1. To supply energy to the pallet 102, the pallet 102 includes an electrical coupling device 116. The electrical coupling device 116 receives electrical energy from a conventional variable electrical source controlled by a controller (not shown) for applying a controllable heat to the substrate. The female portion of this device 116 is carried by the pallet 102, and the male portion is coupled to the linearly slidable track 120. Alternatively, the male and female portions can be interchanged between the pallet 102 and the linearly slidable track 120. These portions of the electrical coupling device 116 are shown in the disengaged position as is evident by the position of a cone-shaped male connector 117 included in the male portion of the electrical coupling device 116.

The male and female portions are engaged only when the pallet 102 has been indexed to a position in which the two portions of the electrical coupling device 116 are substantially aligned. To monitor this alignment, portions of a conventional linear positioning sensor 112 (such as, for example, a magnetic or inductance sensor) are coupled to the pallet 102 and the linearly slidable track 120. Additionally, a stroke sensor included in the electrical coupling device 116 (not shown) which monitors vertical displacement is used. An indication from the sensor 112 that the linear positioning of the pallet 102 is incorrect or from the stroke sensor that the vertical displacement of the male and female portions of the electrical coupling device 116 is incorrect, prevents powering up of the portions of the electrical coupling device 116.

The pallet 102 further includes one or more magnets 106 at opposite ends of the pallet 102 (only one end shown) for magnetically coupling pallets 102 adjacent to each other. The purpose of this coupling will be described shortly.

Referring to FIG. 2, this figure shows a perspective view of an assembly of the pallet 102 and the position of the vacuum plenum 110 with respect to the pallet 102 according to the present invention. The pallet assembly 200 comprises a vacuum transfer plate 202, a heater plate 204, a carrier plate 216, and a transport plate 210.

The vacuum transfer plate 202 and the heater plate 204 have a first and second plurality of perforations 201, 203, respectively, which are substantially aligned (see axis 205) to each other in order to apply a vacuum to the substrate carried by the vacuum transfer plate 202. The heater plate 204 is a conventional heating element such as a foil heater, positioned below the vacuum transfer plate 202, which applies a controllable heat to the vacuum transfer plate 202. As a result, the vacuum transfer plate 202 applies heat to the substrate in a controllable manner. To generate heat, the heater plate 204 includes an electrical coupling extension 207, which is keyed into the 216 in the recessed area 209. The wires of the electrical coupling extension 207 are connected in a conventional manner to the male portion of the electrical coupling device 116 shown in FIG. 1.

The carrier plate 216 has two perforations 208 that are coupled to the vacuum transfer plate 202 and the heater plate 204 for applying a vacuum to the substrate. To provide adequate planar support and an adequate vacuum to the heater plate 204, and the vacuum transfer plate 202, the carrier plate 216 includes a plurality of recessed channels 219 surrounded by metal portions 206 that provide planar support to the heater plate 204 and the vacuum transfer plate 202 and an adequate vacuum by way of the channels 219.

The vacuum plenum 110, which is coupled to a vacuum source (not shown) by way of a hose 212, applies a vacuum to the pallet assembly 200 when the transport plate 210 is positioned along a cavity 214 included therein. The vacuum supplied by the plenum is applied to the carrier plate 216 by way of cavities 301 included in two of three thermally insulated posts 302 that are coupled between the transport plate 210 and the carrier plate 216 for support (see side view of pallet 102 in FIG. 3). The cavities 301 are substantially aligned with the perforations 208 of the carrier plate 216 in order to minimize losses in the inherent force of the vacuum. Additionally, the posts 302 are thermally insulated in order to prevent thermal conduction between the transport plate 210 and the carrier plate 216. This is an important feature necessary for maintaining a controllable temperature in each of the plurality of pallets 102.

Figure 3:
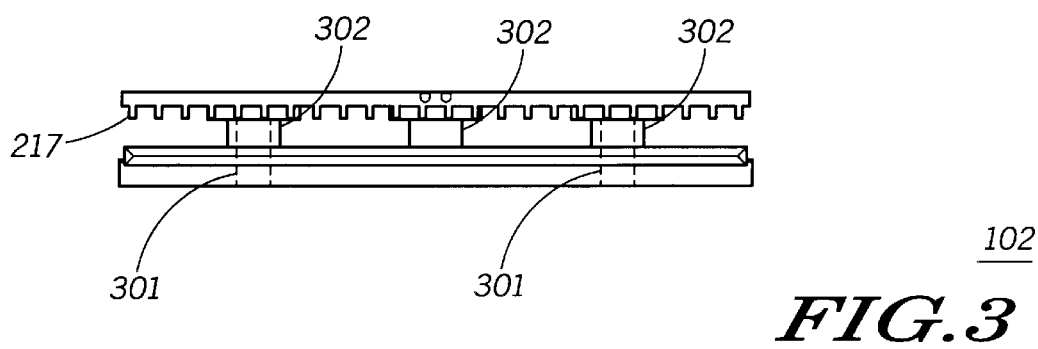
FIG. 3 shows a side view of the pallet according to the present invention.

Also evident from FIGS. 2 and 3, are a plurality of fins 217 that are an integral part of the carrier plate 216 and traverse the bottom surface of the carrier plate 216. These fins 217 are utilized for slow dissipation of heat from the pallet assembly 200 when the heater plate 204 is disabled. It will be appreciated that if there is a need to accelerate the dissipation of heat from the pallet assembly 200 when the heater plate 204 is disabled, a fan (not shown) may be used for forcing air flow through the plurality of fins 217.

Figures 4A, 4B:
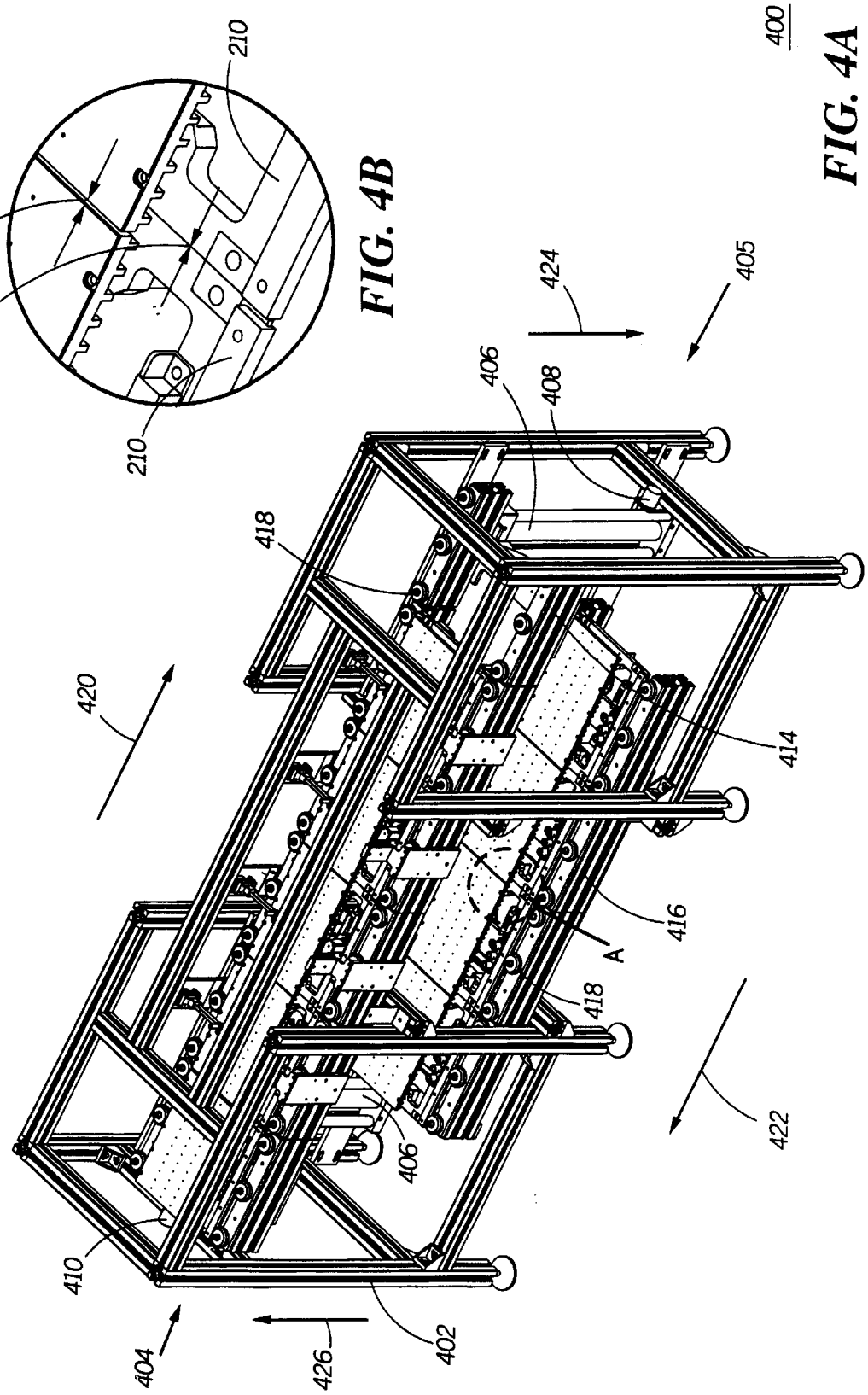
FIG. 4 shows a perspective view of an apparatus utilizing a plurality of the pallets shown in FIG. 1 for indexing a substrate according to the present invention.

FIG. 4 shows a perspective view of the apparatus 400 for indexing a substrate according to the present invention. The apparatus 400 utilizes a plurality of the pallets 102 discussed above and illustrated in FIGS. 1–3. As shown, the apparatus 400 comprises pallets 102 positioned at two levels guided by first and second linearly slidable tracks 414, 416. The linearly slidable tracks 414, 416 and the plurality of pallets 102 are supported by extrusions 402 used throughout the apparatus 400. Guide rollers 418 positioned throughout the linearly slidable tracks 414, 416 are used for guiding the pallets 102 in a linear direction.

As noted earlier, minimizing the conduction of heat from the pallets 102 when a controllable heat is being applied by the heater plate 204 is an important objective. To further this objective, the transport plate 210 is designed to have a linear length that is longer than the linear length of the pallet assembly 200, thereby thermally isolating the plurality of pallets 102 from each other while they are guided by the first linearly slidable tracks 414. Detail A shows this feature by illustrating the closest positioning between two pallets 102. As the detail illustrates, the transport plate 210 of each of two adjacent pallets 102 make contact with each other (detail 413). Because the pallet assembly 200 has a shorter linear length, the pallet assemblies 200 of each pallet 102 are kept thermally isolated from each other by an air gap (detail 412).

Figure 5:
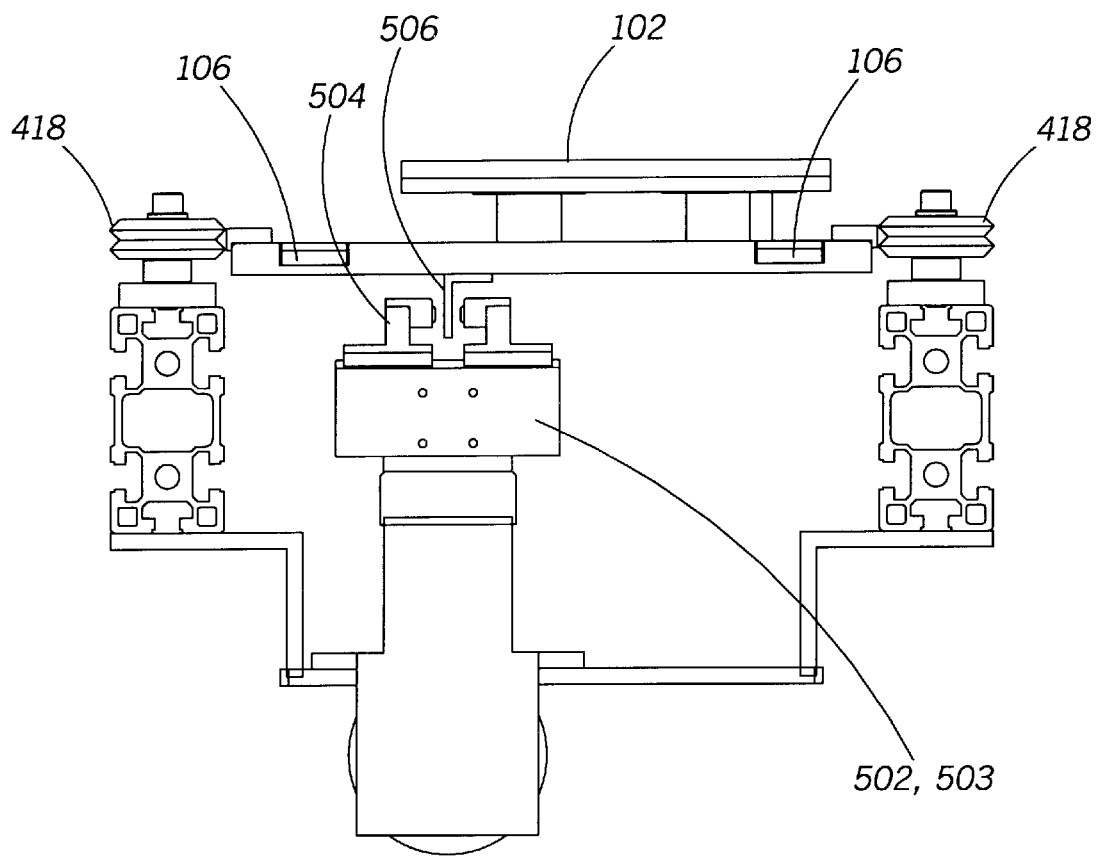
FIG. 5 shows a front view of the pallet and a motor for guiding the pallet on a linearly slidable track according to the present invention.

The apparatus 400 further includes first and second motors 502, 503 (not visible in FIG. 4—see instead FIG. 5). The first and second motors 502, 503 are preferably pneumatic cylinders. However, alternatively, they may be conventional linear motors. The first motor 502 is used for linearly driving at least one of the plurality of pallets 102 in a first direction 420 on the first linearly slidable track 414, while the second motor 503 is used for linearly driving at least one of the plurality of pallets 102 in a direction 422 opposite to the first direction 420 on the second linearly slidable track 416. Additionally, the apparatus 400 includes first and second elevators 404, 405, which are coupled to the first and second linearly slidable tracks 414, 416, respectively, for transferring at least one of the plurality of pallets 102 between the first and second linearly slidable tracks 414, 416.

That is, the second elevator 405 transfers pallets 102 from the first linearly slidable track 414 to the second linearly slidable track 416 in a downward direction 424, while the first elevator 404 transfers pallets 102 from the second linearly slidable track 416 to the first linearly slidable track 414 in an upward direction 426. Each of the first and second elevators 404, 405 comprise conventional push-off mechanisms 408, 410 (such as, for example, a pneumatic air cylinders) activated by a controller and positioned at opposite ends of the first and second elevators 404, 405 for dispensing a pallet onto a corresponding one of the first and second linearly slidable tracks 414, 416, respectively.

For example, a pallet 102 being transferred from the second to the first linearly slidable track travels upwards until the pallet 102 is planar with the first linearly slidable track 414. Once it reaches this position, push-off mechanism 410 dispenses the pallet in direction 420, thereby helping to magnetically couple the dispensed pallet 102 with the adjacent pallet 102 positioned on the first linearly slidable track 414. The magnetic coupling is accomplished by way of the magnets 106 positioned at opposite ends of the pallet 102. Once the pallets 102 have been magnetically coupled, the pallet 102 adjacent to the dispensed pallet 102 is indexed by the first motor 502 in a forward direction 420. This indexes the outermost pallet 102 originally positioned on the first linearly slidable track 414 towards the second elevator 405. The second elevator then lowers and transfers the outermost pallet 102 from the first linearly slidable track 414 to the second linearly slidable track 416 in the same manner just described. The indexing process just described in effect cycles periodically a pallet 102 between the first and second linearly slidable tracks 414, 416, respectively. This cycling effect is indicated by the arrows 420, 424, 422, 426.

FIG. 5 shows a front view of the pallet 102 and its corresponding motor 502 (or 503) for guiding the pallet 102 on a corresponding linearly slidable track 414 (or 416) according to the present invention. The motor 502 is, for example, a servo motor, which linearly displaces the pallet 102 in a predetermined direction each time an indexing step is invoked by the controller. To couple the motor 502 with the pallet 102, the motor 502 includes grippers 504 which couple frictionally with a bracket 506 included in the pallet 102. Preferably, the grippers 504 engaged the bracket 506 of the pallet 102 nearest the pallet 102 being dispensed by the elevator. Once the grippers 504 are engaged, the motor 502 indexes the pallet 102 forward, thereby pulling, by way of magnetic coupling, the pallet 102 that was dispensed by the elevator and pushes forward the pallets 102 ahead of it, thereby displacing the outermost pallet 102 onto an elevator that transfers it to an alternate linearly slidable track.

Figure 6:
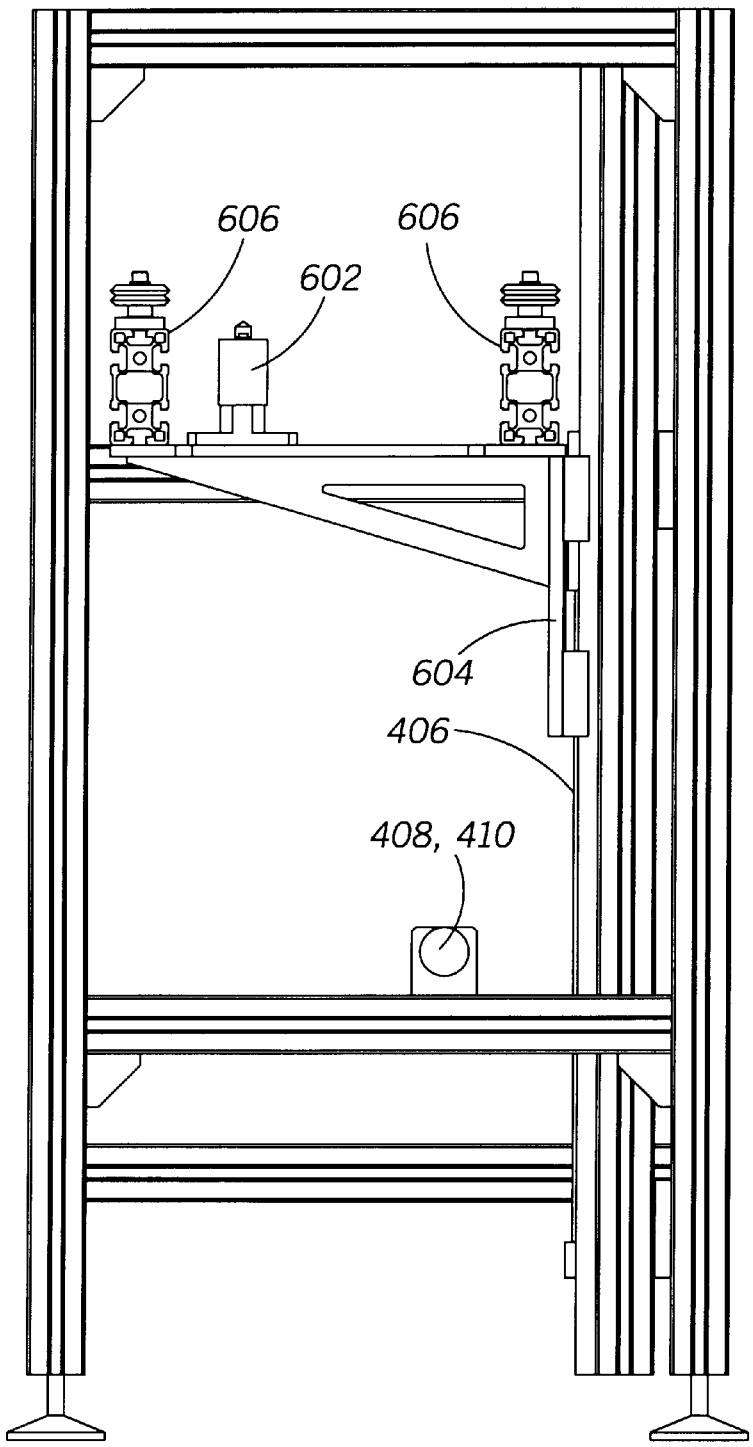
FIG. 6 shows a side view of an elevator according to the present invention.

FIG. 6 shows a side view of an elevators 404 (or 405) according to the present invention. As illustrated, the elevator 404 comprises a conventional pneumatic air cylinder 406 and a lift 604 coupled thereto. The pneumatic air cylinder 406 is used for controllably driving the lift 604 in an upwards or downwards direction for the purpose of transferring pallets 102 between the first and second linearly slidable tracks 414, 416. The lift 604 comprises a conventional locking mechanism 602 and a small portion of a linearly slidable track 606 having a length equal to a pallet 102. The locking mechanism 602 is activated while transferring a pallet 102 between the first and second linearly slidable tracks 414, 416, and is used for limiting linear motion on the linearly slidable track 606 during the transfer process.

Figure 7:
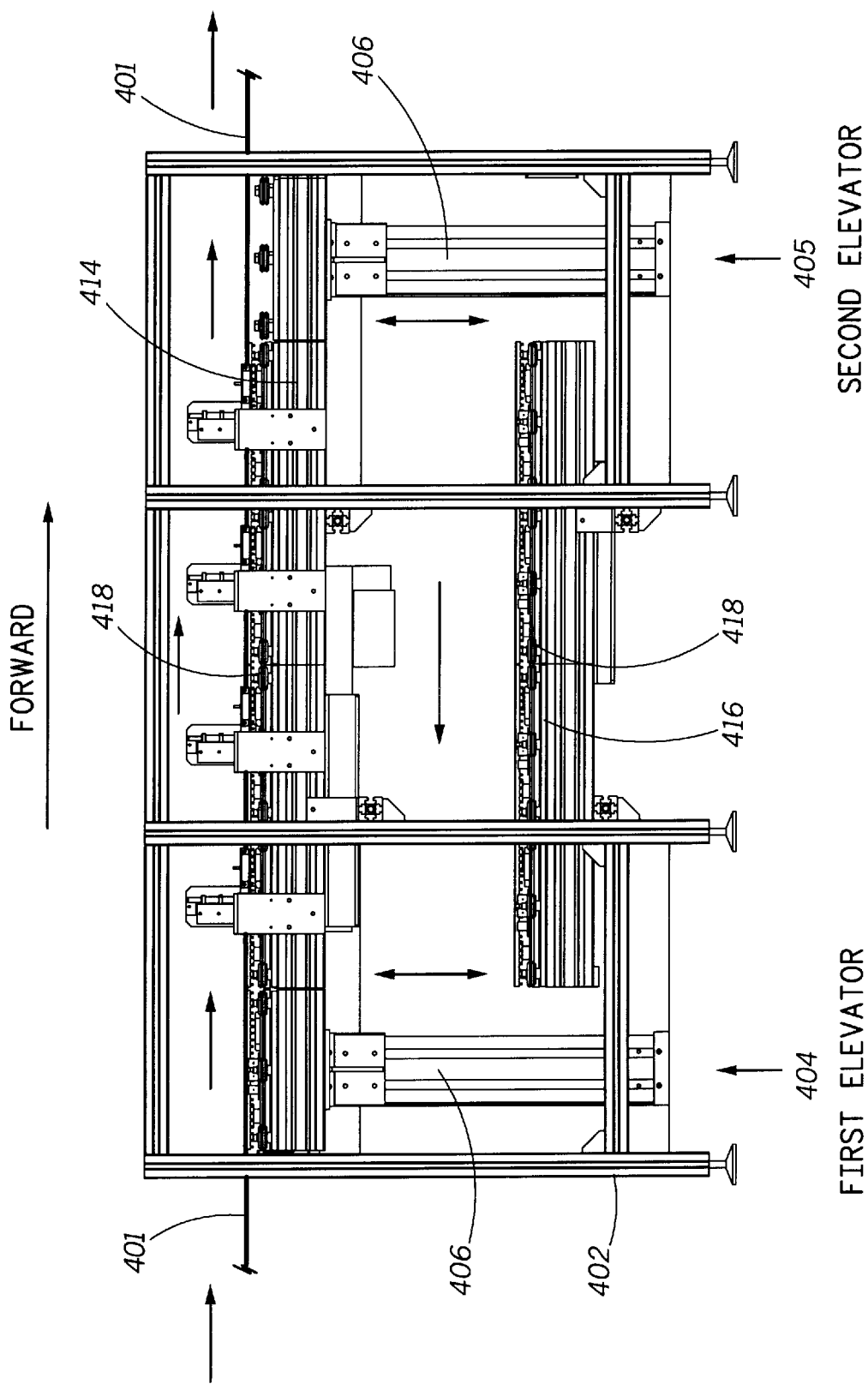
FIG. 7 shows a side view of the apparatus according to the present invention.

FIG. 7 shows a side view of the apparatus 400 showing a portion of a substrate 401 carried by the apparatus 400 for illustration purposes according to the present invention. As noted by the arrows, the substrate 401 is displaced into and out of the apparatus 400 by the pallets 102 as they are indexed in a forward direction. Note, only the pallets 102 positioned on the first linearly slidable track 414 are coupled to the vacuum plenum 110. Hence, neither the incoming nor the outgoing pallets 102 of the first linearly slidable track 414 apply adhering forces to the substrate 401.

During an indexing cycle of the first linearly slidable track 414, the controller (not shown) activates the push-off mechanism 410 of the first elevator 404 to displace an incoming pallet 102 so that it becomes magnetically coupled with an adjacent pallet 102 carried by the first linearly slidable track 414. The controller then activates the first motor 502 and indexes the pallets 102 carried by the first linearly slidable track 414 a distance equal to a length of one pallet 102. The indexing step simultaneously draws the incoming pallet 102 carried by the first elevator 404 onto the first linearly slidable track 414, and displaces the outermost pallet 102 guided by the first linearly slidable track 414 onto the second elevator 405.

To synchronize the cyclical transfer of pallets 102 between the first and second linearly slidable tracks 414, 416, the first and second elevators 404, 405 are preferably raised and lowered at substantially the same time. Hence, when the outgoing pallet 102 of the first linearly slidable track 414, now carried by the second elevator 405, is transferred to the second linearly slidable track 416, both the first and second elevators 404, 405 are lowered together. When both elevators reach a planar position with the second linearly slidable track 416, the controller activates the push-off mechanism 408 of the second elevator 405 to displace the pallet 102 carried by it and to magnetically coupled it with an adjacent pallet 102 carried by the second linearly slidable track 416.

The controller then activates the second motor 503 and indexes the pallets 102 carried by the second linearly slidable track 416 a distance equal to a length of one pallet 102. The indexing step simultaneously draws the incoming pallet 102 carried by the second elevator 405 onto the second linearly slidable track 416, and displaces the outermost pallet 102 guided by the second linearly slidable track 416 onto the first elevator 404. To recycle a pallet 102 unto the first linearly slidable track 414, both elevators 404, 405 are activated by the controller and raised until they reach a planar position with the first linearly slidable track 414. The pallet transfer process described above is reinitiated to continue the indexing cycle ad infinitum.

As should be apparent from FIG. 7, each linearly slidable track 414, 416 carries four pallets 102 at a time. What may not be apparent, however, is that only the top four pallets carried by the first linearly slidable track 414 apply a vacuum and controllable heat to the substrate 401 as it is being indexed through the apparatus 400, while the four pallets 102 carried by the second linearly slidable track 416 do not. This is because the purpose of the second linearly slidable track 416 is to recycle the outgoing pallets 102 of the first linearly slidable track 414. The recycling of pallets 102 on the first linearly slidable track 414 effectively creates a vacuum conveyor.

It will be appreciated that, alternatively, more than one pallet 102 can be cycled between the first and second linearly slidable tracks 414, 416. Similarly, it will be appreciated that an indexing step may comprise displacing pallets 102 a distance greater than one pallet 102 (e.g., 2 or 3 pallets, etc.).

It will also be appreciated that the plurality of pallets 102 carried by the first linearly slidable track 414 divide a portion of the substrate 401 enclosed by the apparatus 400 into a plurality of controllable temperature zones. Each controllable temperature zone encloses at least one of a plurality of circuits carried by the substrate 401. During normal operating conditions, the plurality of controllable temperature zones maintain different selectable temperature profiles, which together correspond to a predetermined temperature profile adequate for affixing at least one solderable component of a corresponding one of the plurality of circuits as it is indexed through the plurality of controllable temperature zones.

Note the heater plate 204 of a pallet 102 while carried by the first or second elevators 404, 405 is disabled and applies no heat to a portion of the substrate 401 making contact with it. Hence, the controllable heat applied by the plurality of pallets 102 carried by the first linearly slidable track 414 (in this example shown as four pallets 102) correspond to the plurality of controllable temperature zones that apply the predetermined temperature profile to portions of the substrate 401.

Figure 8:
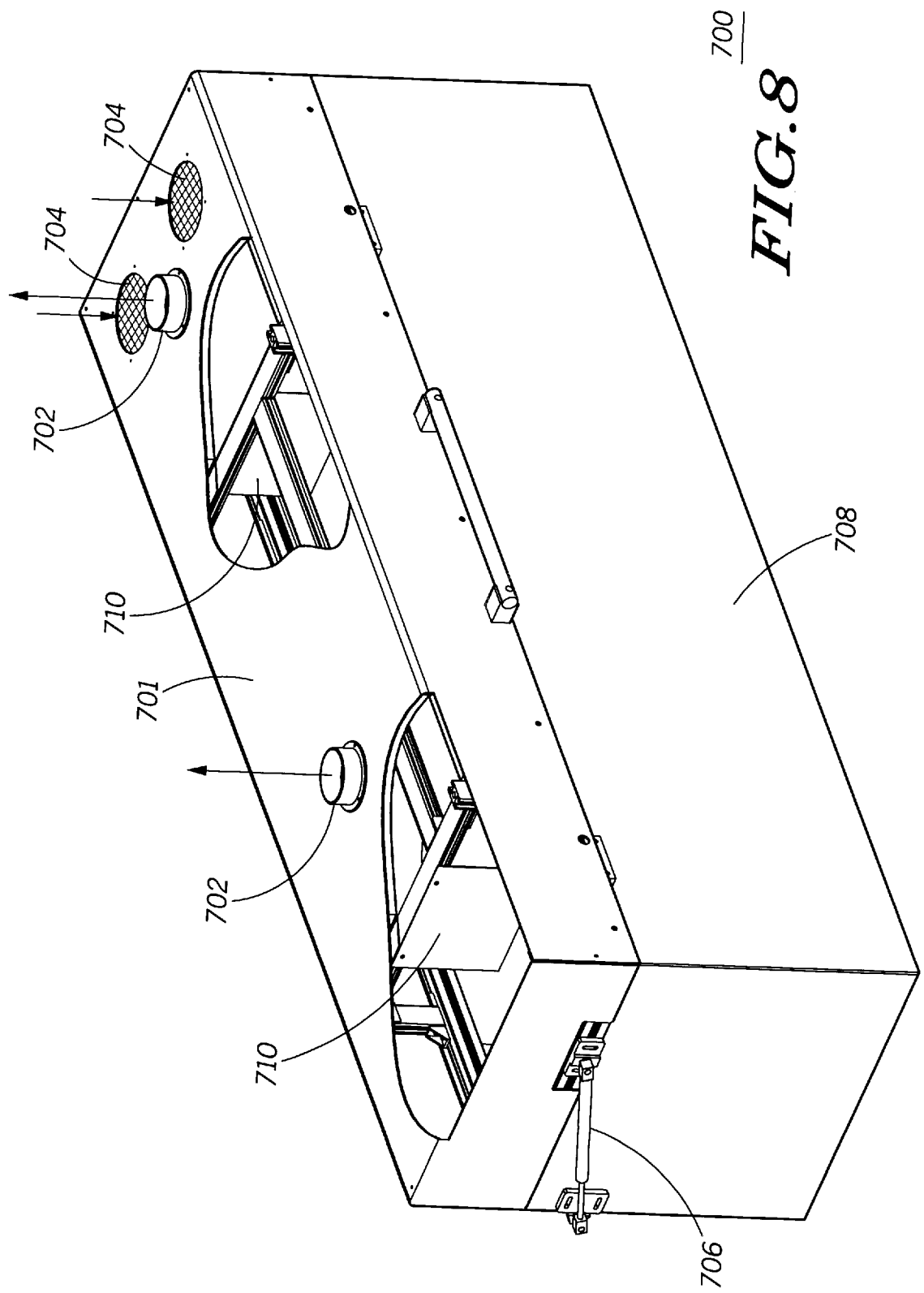
FIG. 8 shows a perspective view of a shroud for enclosing the apparatus according to the present invention.

Generally the process of soldering components onto a substrate results in chemical reactions that release of gaseous fumes, which may include toxic materials. In order to direct the flow of such toxins, the apparatus 400 is preferably enclosed by a shroud. FIG. 8 shows a perspective view of the shroud 700 used for enclosing the apparatus 400 according to the present invention. The shroud 700 comprises a hood 701 and a body cover 708. The hood 701 includes a conventional lever 706, exhaust hoses 702, and fans 704. The lever 706 is used for controllably raising and lowering the hood 701 in a safe manner. Although not shown, a lever 706 is coupled to the hood and the body cover on both sides of the hood 701. The exhaust hoses 702 are coupled to a low vacuum source (not shown) for extracting fumes resulting from the soldering process.

The fans 704 are preferably positioned above the second elevator 405. These fans 704 help to quickly cool off a portion of the substrate 401, which has been indexed through the plurality of controllable temperature zones. To prevent these fans 704 from substantially affecting the temperature profile of the plurality of controllable temperature zones, panels 710 are placed at the incoming and outgoing portions of the first linearly slidable track 414 to minimize the flow of air in and out of the plurality of controllable temperature zones.

Figure 9:
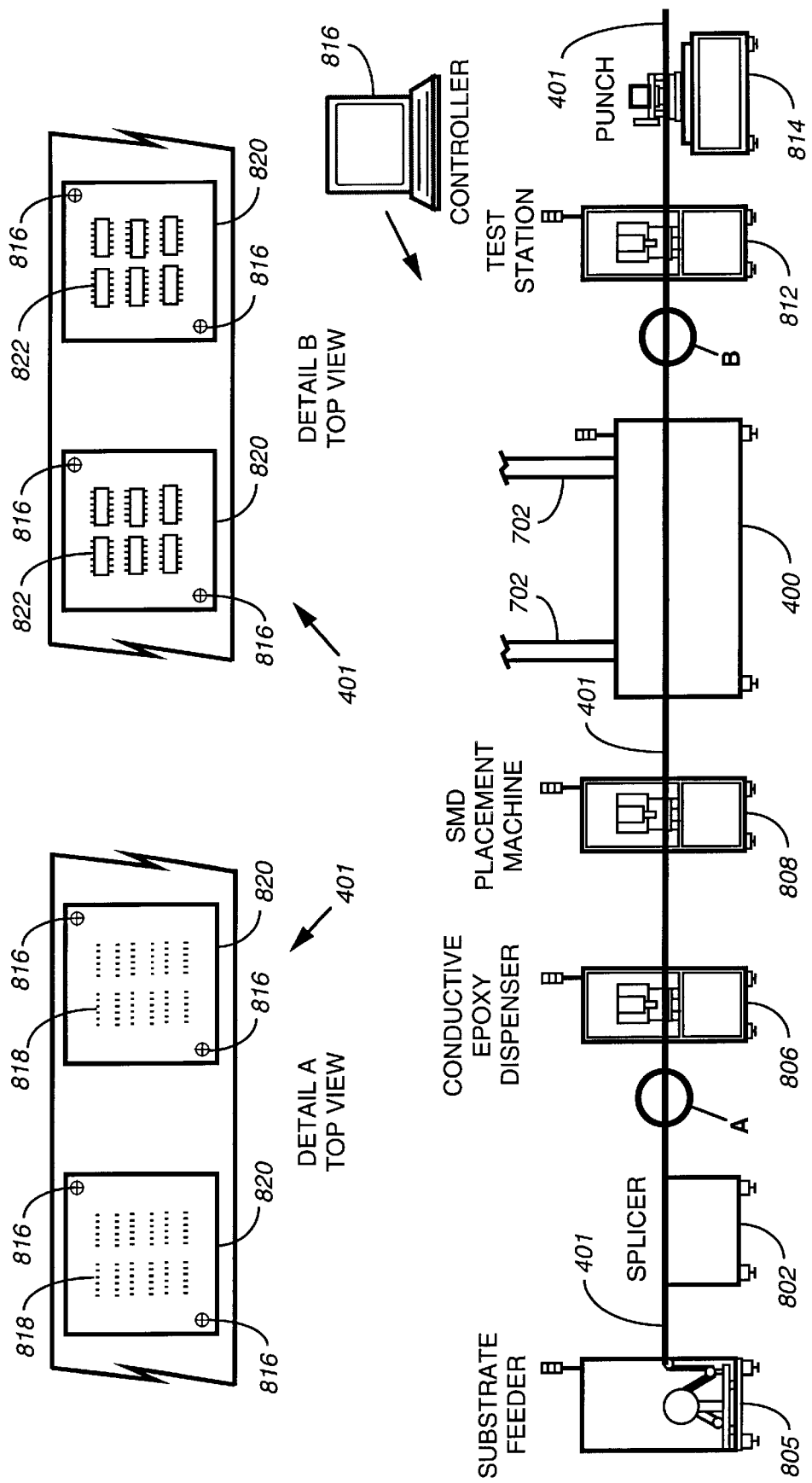
FIG. 9 shows a manufacturing line utilizing the apparatus according to the present invention.

The apparatus 400 described above is preferably used in a manufacturing line for manufacturing electronic circuits on a substrate 401. FIG. 9 illustrates an embodiment of such a manufacturing line 800 according to the present invention. It will be appreciated that alternative manufacturing line schemes suitable to the present invention may be used.

The manufacturing line 800 comprises a conventional substrate feeder 805, a splicer 802, a conductive epoxy dispenser 806, an SMD (surface mount device) placement machine 808, the apparatus 400, a conventional test station 812, a PCB punch-out machine 814 and a controller 816 (such as a conventional computer system) for controlling operation of the manufacturing line 800.

The splicer 802 is a conventional splicer used for splicing the substrate 401 when the substrate feeder 805 has exhausted the supply of substrate 401 material. As shown in Detail A, the substrate 401 comprises a plurality of PCB's 820 (printed circuit boards), each including at least one fiducial 816, and a plurality of contact pads 818 for placement of conductive epoxy thereon, which allows for electrically affixing components to the substrate 401. The fiducials 816 are used by the stations 806, 808, 812, 814 to perform their respective operations on the PCB's 820 in an accurate manner.

The conductive epoxy dispenser 806 and the SMD placement machine 808 are conventional manufacturing machines for placing surface mount components on the substrate 401. The substrate feeder 805 and the apparatus 400 together index the substrate 401 a predetermined distance along the manufacturing line 800. To perform this task, the substrate feeder 805 and the apparatus 400 are indexed at substantially the same time. The indexing operation of the substrate 401 is important, because it provides time for each manufacturing machine (e.g., SMD placement machine, test station 812, etc.) to perform its operation on the substrate 401 while the substrate 401 stationary. The mechanical operation of the apparatus 400 remains as described above. Its function, as described earlier, is preferably for affixing components 822 to PCB's 820 (see Detail B) that have been placed by the SMD placement machine 808 under the direction of the controller 816.

The manufacturing process is completed by the operations of the test station 812 and the PCB punch-out machine 814. The test station 812 performs conventional test functions for determining whether a substantial number of manufacturing steps preceding the test station 812 were performed correctly. Upon the test station 812 detecting a properly manufactured PCB 820, the PCB punch-out machine 814 is directed by the controller 816 to punch out the PCB 820 from the substrate 401. The remaining substrate 401 material is then indexed out of the PCB punch-out machine 814 and discarded in a conventional manner.

It will be appreciated by one of ordinary skill in the art that the embodiment just described, where the substrate 401 is contiguous throughout the manufacturing line 800, is operable also in a manufacturing line with a plurality of substrates indexed periodically through each station.

Figure 10:
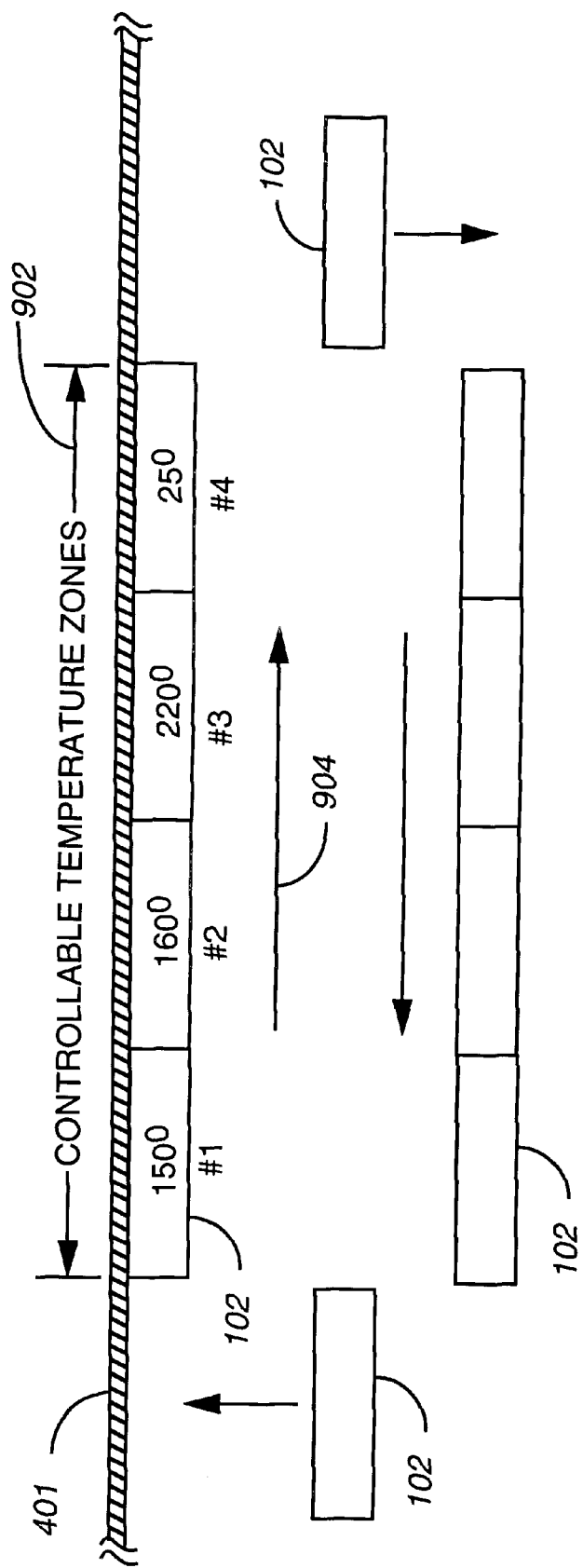
FIG. 10 shows the temperature profile of the plurality of controllable temperature zones under normal operating conditions according to the present invention.

As noted earlier, during normal operating conditions, the plurality of controllable temperature zones of the apparatus 400 maintain different selectable temperature profiles, which together correspond to a predetermined temperature profile adequate for affixing at least one solderable component of a corresponding circuit as it is indexed through the plurality of controllable temperature zones. FIG. 10 illustrates an example of a temperature profile comprising four controllable temperature zones 902 adequate for affixing components to corresponding circuits of the substrate 401 according to the present invention. It will be appreciated by one of ordinary skill in the art that, alternatively, other temperature profiles suitable to the present invention may be used.

As the example shows, there are four temperature zones (150°, 160°, 220°, and 25°) each temperature corresponding to the heat applied by a pallet 102 on the first linearly slidable track 414 to a portion of the substrate 401. As was described earlier, only the pallets 102 guided by the first linearly slidable track 414 are directed by the controller 816 to apply heat to portions of the substrate 401. This is evident from the pallets 102 in FIG. 10 that show no heat setting, i.e., those pallets 102 which are transferred between the first and second linearly slidable tracks 414, 416 by the elevators 404, 405, and the pallets 102 located on the second linearly slidable track 416.

To achieve the temperature profile shown, the controller 816 directs the temperature setting of each pallet 102 as it is indexed on the first linearly slidable track 414. Particularly, as a pallet 102 is indexed in a forward direction 904 the controller 816 adjusts the temperature of the pallet 102 depending on its position relative to the first linearly slidable track 414. To assist the reader in keeping track of pallet positions, the pallets 102 have been numbered 1–4 in FIGS. 10–16.

For example, the pallet 102 retrieved from the first elevator 404 by the first linearly slidable track 414 is directed to a temperature of 150° (i.e., position #1). This temperature is monitored by the thermal sensor 118 positioned above it. At the next indexed positioned (i.e., position #2) the pallet 102 is raised to 160°. Although during the indexing operation electrical coupling is removed from the heater plate 204, thereby disabling heat to the pallet 102, the amount of time to index a pallet 102 is relatively short (e.g., 3 seconds). Consequently, the reduction in the heat of the pallet 102 has a negligible effect.

As shown at the next indexed location (position #3), the pallet 102 is raised to a peak temperature of 220°. At the final position (position #4) the controller 816 disables the heater plate 204 in order to lower the pallet temperature to room temperature (i.e., 25°). Although the fins 217 of the pallet 102 serve as a heat sink, the rate of heat dissipation is undesirably slow. In order to accelerate the cooling process of the pallet 102, a fan (not shown) is used for applying air flow across the fins 217 of the pallet 102. The fan is preferably an air blade aligned with the fins 217. At the next indexing step, i.e., at the position of the second elevator 405, the fans 704 positioned above the second elevator 405 serve to further cool down the substrate 401.

Under normal operating conditions, the temperature profile just described remains substantially constant at pallet positions #1–4 as the manufacturing line 800 indexes the substrate 401. However, when the manufacturing line 800 ceases operation, because, for example, one of the manufacturing machines has experienced a fault, the substrate 401 carried by the apparatus 400 must be acted upon in a relatively short period of time in order to prevent damage to the portions of the substrate 401 which have already been exposed to a portion of the temperature profile. FIGS. 11–13 show how the controllable temperature zones are adjusted to salvage portions of the substrate 401 when the manufacturing line 800 ceases to operate according to the present invention.

To salvage the portions of the substrate 401 enclosed by the apparatus 400, each pallet 102 of the apparatus 400 is directed by the controller 816 to complete the temperature profile. This process, which is shown in FIGS. 11–13, in effect cycles in a reverse direction 906 a temperature profile at each pallet 102 starting at pallet position #3 working its way back to pallet position #1. In particular, FIG. 11 shows a first step of how the temperature setting of each pallet 102 is adjusted after the manufacturing line 800 has ceased operation.

For example, in position #3 the pallet 102 is directed by the controller 816 to adjust its temperature to room temperature (i.e., 25°). This is because in position #3 the pallet 102 under normal operating conditions had already been heated to 220°, i.e., the peak temperature of the temperature profile. Hence, the subsequent step would be to disable heat to the pallet 102 and reduce the temperature to 25°. To accommodate rapid reduction of heat to the pallet 102 in position #3, an air blade fan located on the first linearly slidable track 414 at position #3 is used (similar to the one used at position #4). As it will be shown, pallet positions #1–2 also require air blade fans.

In position #2, the pallet 102 is directed by the controller 816 to raise the temperature to 220°. This is because the prior temperature setting was at 160°. Similarly, in position #1 the pallet 102 is directed by the controller 816 to raise the temperature to 160° as a subsequent step to the prior setting of 150°. Once the temperature changes illustrated in FIG. 11 have taken place, the temperature profile of each pallet 102 continues to be cycled as illustrated in FIGS. 12 and 13. At position #2 in FIG. 12 the heater plate 204 of the pallet 102 is disabled and the air blade is applied to the fins 217 of the pallet 102 to accelerate cooling of the pallet 102 to room temperature, and the pallet 102 in position #1 is raised to 220°. Lastly, in FIG. 13 the heater plate 204 of the pallet 102 in position #1 is disabled and the air blade is applied to the fins 217 of the pallet 102 to cool the pallet 102 to room temperature At this point, all the portions of the substrate 401 have been subjected to a desired temperature profile, thereby adequately affixing a corresponding number of solderable components to circuits of the substrate 401.

The process just described helps to prevent damage to circuits exposed to a portion of a temperature profile, thereby salvaging portions of the substrate 401 enclosed by the apparatus 400. This feature, which is not present in conventional prior art manufacturing ovens, is substantially advantageous in that it eliminates the need to splice out portions of the substrate 401, thereby reducing cost and downtime of the manufacturing line 800.

Figure 14:
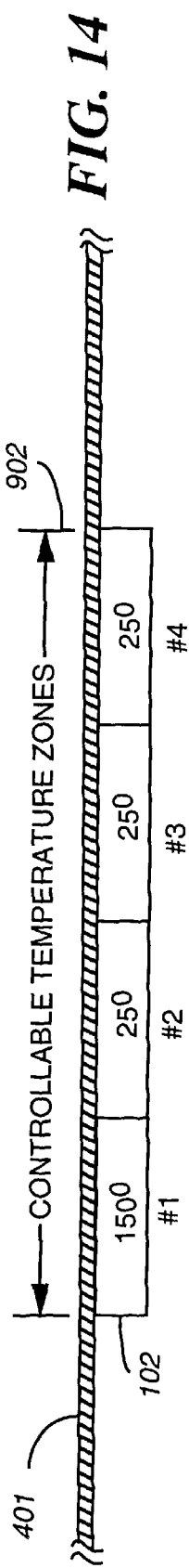
FIGS. 14–16 show how the controllable temperature zones are readjusted to achieve a temperature profile under normal operating conditions when the manufacturing line resumes operation according to the present invention.
Figure 15:
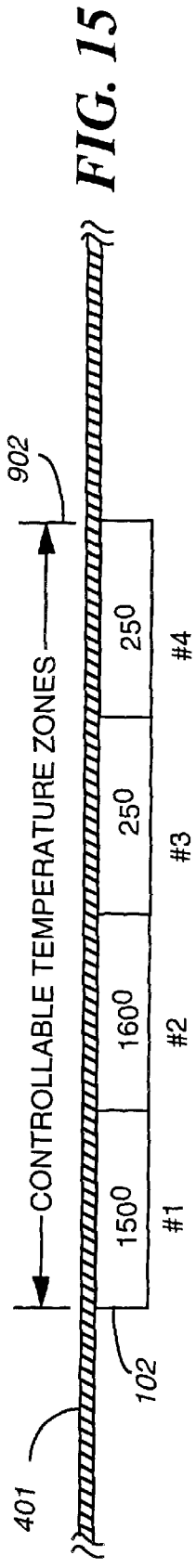
Figure 16:
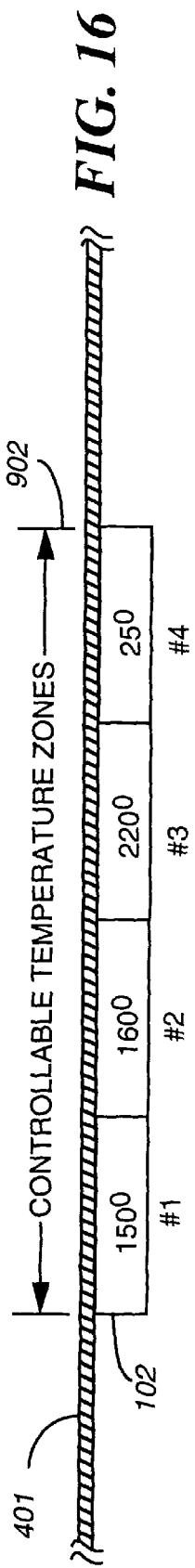

FIGS. 14–16 show how the controllable temperature zones are readjusted to achieve a temperature profile under normal operating conditions when the manufacturing line 800 resumes operation according to the present invention. FIG. 14 shows the first step in reinitiating the temperature profile shown in FIG. 10. At pallet position #1, a new pallet 102, supplied by the first elevator 404 with a portion of a substrate 401 that has not yet been exposed to the desired temperature profile, enters the first controllable temperature zone. Contemporaneous with the entry of the new pallet 102 is the exiting of the pallet 102 in position #4 and the corresponding portion of the substrate 401 that has already been cycled through the temperature profile. The exiting pallet 102 is removed by the second elevator 405 in a manner discussed previously.

Redirecting attention to the new pallet 102 entering position #1, the temperature profile is reinitiated by the controller 816 by activating the heater plate 204 to a temperature of 150°. At the next indexing step, this same pallet 102 is in position #2, and a new pallet 102 enters at position #1. The pallet 102 in position #2 is now adjusted to a temperature of 160°, while the pallet in position #1 is set to 150°. After the next indexing step, the pallet in position #2 is now in position #3 adjusted to a temperature of 220°. At this point, the temperature profile of the four controllable zones resume normal operating conditions following the process described earlier by way of FIG. 10.

Although the above method is preferably applied to the apparatus 400 described above, it will be appreciated that the same method of cycling the temperature profile through each controllable temperature zone to salvage portions of the substrate when the manufacturing line 800 ceases operation may be adapted to conventional ovens. For example, a conventional convection reflow oven with a continuous belt conveyor may be modified to divide a portion of the substrate enclosed by the oven into controllable temperature zones. Each zone in turn may be directed by a controller to cycle the temperature profile when the manufacturing line ceases to operate, thereby avoiding damage to portions of the substrate. Such a modification to convection ovens may also be applied to conventional radiation and conduction ovens.

The embodiments of the present invention described above are advantageous over prior art systems in several ways. The apparatus 400 described above is a substantial departure from traditional prior art machines, such as reflow ovens, for affixing components to a substrate. Particularly, the apparatus 400 utilizes a plurality of pallets 102, each of which can apply a controllable heat to a portion of the substrate not possible in prior art ovens, such as air convection ovens. Additionally, the indexing process used by the apparatus 400 allows the apparatus 400 to be synchronized with other machines in a manufacturing line, which require a predetermined time for completing a designated task—a feature not present in prior art systems. Yet another advantage over prior art systems is the capability of the apparatus 400 to salvage portions of the substrate 401 even when the manufacturing line 800 ceases operation. Consequently, the manufacturing line 800 allows for the manufacture of substrates 401 carrying conventional electronic and electromechanical components at a low cost and with a substantially high level of quality that is repeatable over numerous PCB's 820 carried by the substrate 401.

Although the invention has been described in terms of a preferred embodiment it will be obvious to those skilled in the art that many alterations and variations may be made without departing from the invention. Accordingly, it is intended that all such alterations and variations be considered as within the spirit and scope of the invention as defined by the appended claims.

What is claimed is:

1. In an apparatus enclosing a portion of a substrate having a plurality of circuits, a method for affixing at least one component to a corresponding one of the plurality of circuits, comprising the steps of:

indexing the substrate periodically through the apparatus a distance equal to at least one of the plurality of circuits;

dividing the portion of the substrate enclosed by the apparatus into a plurality of controllable temperature zones,
   wherein each controllable temperature zone encloses at least one of the plurality of circuits, and
   wherein the plurality of controllable temperature zones, under normal operating conditions, maintain different selectable temperature profiles, which together correspond to a predetermined temperature profile adequate for affixing the at least one component to the corresponding one of the plurality of circuits as it is indexed through the plurality of controllable temperature zones; and dynamically adjusting the temperature of each of the plurality of controllable temperature zones upon the indexing step ceasing to operate, until the at least one component of each circuit enclosed by the apparatus has been adequately affixed to its corresponding circuit.

2. The method as recited in claim 1, further comprising the step of dynamically readjusting the temperature of each of the plurality of controllable temperature zones upon the indexing step being reactivated, until each of the plurality of controllable temperature zones achieves a temperature adequate for affixing the at least one component to its corresponding circuit after the corresponding circuit has been indexed through the plurality of controllable temperature zones.

3. The method as recited in claim 1, wherein each of the plurality of controllable temperature zones apply varying temperatures by way of air convection.

4. The method as recited in claim 1, wherein each of the plurality of controllable temperature zones apply varying temperatures by way of radiation.

5. The method as recited in claim 1, wherein each of the plurality of controllable temperature zones apply varying temperatures by way of conduction.

6. An apparatus enclosing a portion of a substrate having a plurality of circuits for affixing at least one component to a corresponding one of the plurality of circuits, comprising:

a conveyor for indexing the substrate periodically through the apparatus a distance equal to at least one of the plurality of circuits;

a plurality of heating elements for dividing the portion of the substrate enclosed by the apparatus into a plurality of controllable temperature zones, wherein each controllable temperature zone encloses at least one of the plurality of circuits; and a controller for controlling operation of the apparatus, the controller adapted to:
   cause the conveyor to index the substrate through the apparatus;
   cause each of the plurality of heating elements, under normal operating conditions, to maintain different selectable temperature profiles, which together correspond to a predetermined temperature profile adequate for affixing the at least one component to the corresponding one of the plurality of circuits as it is indexed through the plurality of controllable temperature zones; and
   cause each of the plurality of heating elements to dynamically adjust the temperature of each of the plurality of controllable temperature zones upon the indexing step ceasing to operate, until the at least one component of each circuit enclosed by the apparatus has been adequately affixed to its corresponding circuit.

7. The apparatus as recited in claim 6, wherein the conveyor is a continuous belt conveyor.

8. The apparatus as recited in claim 7, wherein the plurality of heating elements, controlled by the controller, apply varying temperatures by way of air convection.

9. The apparatus as recited in claim 7, wherein the plurality of heating elements, controlled by the controller, apply varying temperatures by way of radiation.

10. The apparatus as recited in claim 6, wherein the conveyor is a vacuum conveyor comprising:

a plurality of pallets for carrying the portion of the substrate enclosed by the apparatus;

first and second linearly slidable tracks for guiding the plurality of pallets, wherein the first linearly slidable track is positioned above the second linearly slidable track;

a first motor for linearly driving at least one of the plurality of pallets in a first direction on the first linearly slidable track;

a second motor for linearly driving at least one of the plurality of pallets in a direction opposite to the first direction on the second linearly slidable track;

a vacuum source;

a plenum coupled to the vacuum source and coupled to at least one of the plurality of pallets for applying adhering forces to the substrate; and first and second elevators coupled to the first and second linearly slidable tracks for transferring at least one of the plurality of pallets between the first and second linearly slidable tracks.

11. The apparatus as recited in claim 10, wherein each of the plurality of heating elements comprises a corresponding one of the plurality of pallets, and wherein each of the plurality of pallets is electrically coupled to an electrical source, and wherein each pallet is independently controlled by the controller for applying a controllable heat to the portion of the plurality of circuits enclosed by the apparatus.

12. The apparatus as recited in claim 11, wherein each of the plurality of pallets comprises:

a pallet assembly comprising:
    a vacuum transfer plate having a first plurality of perforations for coupling to the substrate,
    a heater plate having a second plurality of perforations for heating the vacuum transfer plate,
    a carrier plate having at least one perforation coupled to the vacuum transfer plate and the heater plate;

a first end of each of a plurality of thermally insulated posts coupled to a bottom surface of the carrier plate; and a transport plate, wherein a top surface of the transport plate is coupled to an end opposite to the first end of the plurality of thermally insulated posts for transporting the pallet assembly.

13. The apparatus as recited in claim 12, wherein the transport plate has a linear length that is larger than the linear length of the pallet assembly, thereby thermally isolating the plurality of pallets from each other while being carried by one of the first and second linearly slidable tracks.

14. The apparatus as recited in claim 12, wherein the first and second plurality of perforations are substantially aligned to each other.

15. The apparatus as recited in claim 12, wherein at least one thermally insulated post has a cavity extending throughout the at least one thermally insulated post, wherein the cavity of the at least one thermally insulated post is coupled to the at least one perforation and to the plenum for applying a vacuum to the pallet assembly.

16. The apparatus as recited in claim 12, wherein a bottom surface of the carrier plate comprises a plurality of fins for dissipating heat from the pallet assembly.

17. The apparatus as recited in claim 16, further comprising a fan for forcing air flow through the plurality of fins, thereby accelerating dissipation of heat from the pallet assembly.

18. The apparatus as recited in claim 11, wherein for at least one pallet, the vacuum conveyor further comprises an electrical coupling device coupled to the electrical source, wherein the electrical coupling device is used for electrically coupling to the at least one pallet, and for regulating its temperature by way of the controller.

19. The apparatus as recited in claim 11, wherein for at least one pallet, the vacuum conveyor further comprises a thermal sensor coupled to the controller for monitoring the temperature of the at least one pallet.

20. The apparatus as recited in claim 11, further comprising:
    a shroud having at least one opening for enclosing a substantial portion of the apparatus;
    at least one hose coupled to at least one opening in the shroud for extracting fumes from chemical reactions occurring on a top surface of the substrate caused by heating of at least one of the plurality of pallets; and
    at least one fan coupled to at least one opening in the shroud for cooling the top surface of the substrate carried by a corresponding one of the plurality of pallets.

21. A manufacturing line comprising the apparatus of claim 6 for affixing components onto the plurality of circuits of the substrate and for indexing the substrate along the manufacturing line.

22. A manufacturing line comprising the apparatus of claim 11 for affixing components onto the plurality of circuits of the substrate and for indexing the substrate along the manufacturing line.

23. In an apparatus enclosing a portion of a plurality of substrates, each substrate having at least one circuit, a method for affixing at least one component to a corresponding circuit of a substrate, comprising the steps of:
    indexing the plurality of substrates periodically through the apparatus a distance equal to at least one of the plurality of substrates;
    dividing the portion of the plurality of substrates enclosed by the apparatus into a plurality of controllable temperature zones,
        wherein each controllable temperature zone encloses at least one of the plurality of substrates, and
        wherein the plurality of controllable temperature zones, under normal operating conditions, maintain different selectable temperature profiles, which together correspond to a predetermined temperature profile adequate for affixing the at least one component to the corresponding circuit of the substrate as it is indexed through the plurality of controllable temperature zones; and
    dynamically adjusting the temperature of each of the plurality of controllable temperature zones upon the indexing step ceasing to operate, until the at least one component of each substrate enclosed by the apparatus has been adequately affixed to its corresponding circuit.

* * * * *